(12) United States Patent
Yokota

(10) Patent No.: US 6,647,047 B2
(45) Date of Patent: Nov. 11, 2003

(54) SEMICONDUCTOR LASER DEVICE CAPABLE OF SUPPRESSING LEAKAGE CURRENT IN LIGHT EMITTING END SURFACE AND METHOD FOR MANUFACTURING THE SAME

(75) Inventor: Makoto Yokota, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/290,177

(22) Filed: Nov. 8, 2002

(65) Prior Publication Data

US 2003/0091079 A1 May 15, 2003

(30) Foreign Application Priority Data

Nov. 12, 2001 (JP) ........................................ 2001-345781
Aug. 9, 2002 (JP) ........................................ 2002-233416

(51) Int. Cl.[7] ................................................ H01G 3/19
(52) U.S. Cl. .......................................... 372/49; 372/87
(58) Field of Search .................... 372/49, 87; 438/487

(56) References Cited

U.S. PATENT DOCUMENTS

2003/0013280 A1 * 1/2003 Yamanaka ............... 438/487

FOREIGN PATENT DOCUMENTS

| JP | 1289289 | 11/1989 |
| JP | 1318270 | 12/1989 |
| JP | 9162496 | 6/1997 |
| JP | 11284279 | 10/1999 |
| JP | 2002-164609 | 6/2002 |

* cited by examiner

Primary Examiner—Leon Scott, Jr.
(74) Attorney, Agent, or Firm—Morrison & Foerster LLP

(57) ABSTRACT

The present invention relates to a semiconductor laser device having a protective coating with a high-reliability formed on an end surface, and to a method for manufacturing the same. According to the present invention, in forming a semiconductor laser device, an electrode comprising Au is patterned so that the electrode does not exist in the vicinity of a light emitting end surface. Thereby, even when an Si film is formed on the light emitting end surface, the Si film is prevented from contacting with the light emitting end surface. In addition, after patterning the electrode, an insulating film (a silicon nitride film) is formed on the electrode for preventing the Si in the protective coating on the end surface from contacting with Au in the electrode, even when the Si film contacts with a surface of the electrode.

19 Claims, 8 Drawing Sheets

US 6,647,047 B2

SEMICONDUCTOR LASER DEVICE CAPABLE OF SUPPRESSING LEAKAGE CURRENT IN LIGHT EMITTING END SURFACE AND METHOD FOR MANUFACTURING THE SAME

BACKGROUND OF THE INVENTION

The present invention relates to a semiconductor laser device having a protective coating with a high-reliability formed on an end surface, and to a method for manufacturing the same.

As shown in FIG. 5, most semiconductor laser devices are composed of, for example, protective coatings 43a and 43b, each having an identical reflectance, formed on light emitting end surfaces 41a and 41b of a GaAs laser chip 4. Reference numeral 42 denotes an active layer of the laser chip 4. In the case where the protective coatings 43a and 43b are composed of $Al_2O_3$ in FIG. 5, if a refractive index of the $Al_2O_3$ film is set to be 1.60 while a refractive index of the laser chip 4 is set to be 3.50, a reflectance of the protective coatings 43a and 43b corresponding to a coating thickness d varies as shown in FIG. 6 (provided that a laser emission wavelength $\lambda$=7800 Å).

FIG. 6 indicates that regardless of the coating thickness d of the protective coatings 43a and 43b, the reflectance thereof is smaller than that of the case without the protective coatings 43a and 43b (i.e. the reflectance of the light emitting end surfaces 41a and 41b). The reflectance becomes smallest when an optical coating thickness (refractive index n×coating thickness d) is an odd multiple of $\lambda/4$, while the reflectance becomes approximately equal to that in the case without the protective coatings 43a and 43b when the optical coating thickness is an integral multiple of $\lambda/2$. This is because the refractive index (1.60) of the protective coatings 43a and 43b is smaller than the refractive index (3.50) of the GaAs laser chip 4.

Contrary to this, in the case where the refractive index of the protective coatings 43a and 43b is larger than the refractive index of the GaAs laser chip 4 (for example, if such material as Si is used as the protective coatings 43a and 43b, the reflectance thereof is larger than that in the case without the protective coatings 43a and 43b, regardless of the coating thickness), the reflectance becomes largest when the optical coating thickness is an odd multiple of $\lambda/4$, while the reflectance becomes approximately equal to that in the case without the protective coatings 43a and 43b when the optical coating thickness is an integral multiple of $\lambda/2$.

In the case of high output semiconductor laser devices with optical output as high as 20 mW or more, as shown in FIG. 7, for increasing optical output Pf from the side of a main emitting end surface (front end surface), the reflectance of the protective coating 43a on the side of the main emitting end surface 41a is generally set lower than that in the case without the protective coating 43a, while the reflectance of the protective coating 43b on the side of a rear emitting end surface 41b is set higher than that in the case without the protective coating 43b.

For example, the reflectance of the protective coating ($Al_2O_3$) 43a on the main emitting end surface 41a is set to be approx. 15% or less. This reflectance is obtained with the coating thickness of approx. 700 Å to 1600 Å.

The protective coating 43b on the rear emitting end surface 41b, if composed with use of a film having a refractive index larger than that of the laser chip 4, is not capable of providing a sufficiently high reflectance as a single layer. Accordingly, an $Al_2O_3$ film with a thickness of $\lambda/4$ as a first layer 431 and a third layer 433, and an amorphous Si with a thickness of $\lambda/4$ as a second layer 432 and a fourth layer 434, are laminated. Then finally, an $Al_2O_3$ film with a thickness of $\lambda/2$ as a fifth layer 435 is laminated. This makes it possible to form a protective coating 43b having a reflectance as high as approx. 85% or more. It is noted that reference numeral 43 denotes an active layer.

Description will now be given of a method for forming protective coatings 43a and 43b having the above-described reflectance on light emitting end surfaces 41a and 41b of a semiconductor laser chip 4.

First, after one side of an n-GaAs substrate is polished, a p-electrode (comprising an ohmic electrode and a bonding electrode) is formed by evaporation or sputtering. A photomask is made thereon and, then, the p-electrode is patterned by etching.

Subsequently, after the other side of the n-GaAs substrate is polished, an n-electrode (comprising an ohmic electrode and a bonding electrode) is formed by evaporation or sputtering according to the above procedures. After that, the electrodes and the substrate are alloyed at appox. 400 to 500° C.

Next, as shown in FIG. 8, a cleavage line 49 is formed by scribing extensively disposed between an electrode 44 of an arbitrary element in a semiconductor laser wafer 5 and an electrode 44' of an adjoining element in direction orthogonal to an emitting section (channel) 42. Then, as shown in FIG. 9, the semiconductor laser wafer 5 is cleaved and divided into a plurality of laser bars (bar-shaped laser chips) 51.

Next, as shown in FIG. 10, a plurality of the laser bars 51 obtained by dividing are loaded in a laser bar fixing device 6 such that the electrodes 44 face towards the same side. All the laser bars 51 should be loaded so that all the emitting end surfaces 41a are positioned on the same side and, therefore, all the emitting end surfaces 41b are positioned on the same side. Next, on the emitting end surfaces 41a and 41b of laser bars 51 loaded in the laser bar fixing device 6, a protective coating having a specified reflectance is formed generally by using a vacuum evaporator 7 schematically shown in FIG. 11. The vacuum evaporator 7 is provided with a vapor source 72, a holder 73 for holding a plurality of the laser bar fixing devices 6, and a crystal oscillator 74 for monitoring the thickness of evaporated films, all in a chamber 71.

Following description discusses procedures of forming the protective coating. First, in the case for evaporating a protective coating onto the emitting end surface 41a, the holder 73 is disposed such that the emitting end surface 41a of a laser bar 51 faces the vapor source 72 side as shown in FIG. 11. Then, the chamber 71 is evacuated through a duct 75. After a specified degree of vacuum is obtained, an evaporation material 76 put in the vapor source 72 is heated and evaporated by electron beams and the like so that a protective coating is evaporated onto the emitting end surface 41a of the laser. After evaporation is completed, the holder 73 is then rotated 180° for evaporating a protective coating onto the emitting end surface 41b according to the above procedures.

Here, a forming speed (evaporation rate) for forming a protective coating on the both light emitting end surfaces 41a and 41b is controlled so as to be approximately constant till completion of evaporation. The evaporation rate is in this case controlled with a heating temperature. In the case of electron beam evaporation, therefore, the evaporation rate may be controlled with the intensity of electron beams. It is well known that in the case of resistance heating, the evaporation rate is controlled with an amount of electric current passed through a resistor. The evaporation rate is generally set in a range between several Å/sec to 30 Å/sec in the case of the evaporation material of $Al_2O_3$ Evaporation is conducted while coating thickness is monitored with use of the crystal oscillator 74. Evaporation is terminated when a prescribed coating thickness is obtained.

Although not shown in FIG. 7, in the case of a high output type semiconductor laser device, a low reflecting protective coating 43a (having a reflectance of approx. 15% or less) is formed on the side of the main emitting end surface 41a, and then a multilayered high reflecting protective coating 43b is formed on the side of the rear emitting end surface 41b. The multilayered high reflecting protective coating 43b is composed of a laminated structure made up of: a first layer 431 and a third layer 433, each consisting of an $Al_2O_3$ film with a thickness equal to $\lambda/4$; a second layer 432 and a fourth layer 434, each consisting of an Si film with a thickness equal to $\lambda/4$; and a fifth layer 435 consisting of an $Al_2O_3$ film with a thickness equal to $\lambda/2$. For evaporation of this film, $Al_2O_3$ and Si are mounted on the vapor source 72 as evaporation materials 76. Then the first layer 431, the third layer 433, and the fifth layer 435, each consisting of an $Al_2O_3$ film are evaporated through irradiation of the evaporation material $Al_2O_3$ with electron beams, and the second layer 432 and the fourth layer 434, each consisting of an Si film, are evaporated through irradiation of the evaporation material Si with electron beams.

However, the above-stated prior semiconductor laser devices have a following problem. In forming protective coatings 43a and 43b of laser chip 4 by evaporation, an oxide ($Al_2O_3$), that is a material of the protective coatings 43a and 43b, is decomposed to generate oxygen immediately after start of evaporation process, which increases partial pressure of oxygen molecules. The oxygen, colliding or bonding with end surfaces 41a and 41b of the laser chip 4, is highly likely to cause damage to the end surfaces 41a and 41b. Further, in the case where active layer 42 of the laser chip 4 and vicinity layers thereof contain aluminum, the damage is considered to be larger. If thus-fabricated semiconductor laser device is operated with high output, necessary reliability may not be provided.

For high output type semiconductor laser devices, as shown in FIG. 12, there has been proposed a method for forming a protective coating 43a on the side of a main emitting end surface 41a of a laser chip 4 utilizing high thermal conductivity of Si, in which an Si film 436 having high thermal conductivity is formed first and then a low reflecting protective coating 437 is formed (JP-A 1-289289). In the drawing, reference numeral 43b denotes a multilayered high reflecting protective coating on the side of a rear emitting end surface 41b composed of a first layer 431, a second layer 432, a third layer 433, a fourth layer 434, and a fifth layer 435, and reference numeral 42 denotes an active layer.

In this example, heat generated in the vicinity of the main emitting end surface 41a by light emission of the semiconductor laser device is efficiently discharged by the Si film 436, which controls deterioration of the semiconductor laser device caused by long term supply of current. The Si film 436 has a film thickness of around $\lambda/4$ (approx. 532 Å in an embodiment).

Further, according to the high output type semiconductor laser device disclosed in the JP-A 1-289289, in forming protective coating 43a on the main emitting end surface 41a, the Si film 436 having high thermal conductivity is formed first for increasing heat dissipation to improve reliability. In this case, the Si film 436 is firstly formed, which is free from generation of oxygen due to decomposition of the material in the process of evaporation, thereby enabling creation of a coating in the vicinity of the emitting end surface 41a of the laser chip 4 immediately after start of evaporation process under conditions of low partial pressure of oxygen. Therefore, an effect of controlling the above-stated damage in the vicinity of the emitting end surface 41a may be achieved.

In this case, however, the Si film 436 has a thickness as high as approx. 532 Å (almost equal to $\lambda/4$), which may cause leakage current in the Si film 436 (light emitting end surface), and may affect oscillation characteristics of the semiconductor laser device.

JP-A 2000-361037 discloses a semiconductor laser device capable of controlling generation of leakage current in the vicinity of the light emitting end surface by setting the thickness of the Si film to 40 Å or less.

According to the above constitution, before an oxide is formed as a protective coating, an Si film is formed, which is free from generation of oxygen due to decomposition. Consequently, creation of the coating is conducted immediately after start of Si film forming under conditions of low partial pressure of oxygen, which prevents oxygen with high energy from colliding or boding with the light emitting end surface. Further, if oxygen is decomposed in the process of oxide forming and so the oxygen partial pressure increases, collision or bonding of the oxygen with the light emitting end surface is prevented. Thus, the damages given to the light emitting end surface in the process of protective coating formation are controlled.

Here, if the semiconductor laser chip has an active layer including Al, the damages given to the light emitting end surface is effectively controlled.

In addition, the Si film has a film thickness as small as 40 Å or less. This reduces generation of leakage current in the Si film or on the light emitting end surface, thereby preventing negative influence on the oscillation characteristics.

Thus, in the case where a protective coating having a specified reflectance is formed on a light emitting end surface of a semiconductor laser chip by evaporation, it becomes possible to reduce damages given to the end surface of a laser chip in creation of a protective coating, and to control generation of leakage current in the vicinity of the end surface of the laser chip. Therefore, it becomes possible to improve reliability of a laser device.

However, in the case where the Si film 436 is formed on the main emitting end surface 41a, as shown in FIG. 13, it is possible that Au in the electrode metal film 45 and Si in the protective coating 437 on the end surface react and Au diffuses into the end surface of the main emitting end surface 41a.

If a region where Au and Si react (Au/Si reaction region 438) exists over an emission point 42a (an active layer part) as shown in FIG. 13, it may cause leakage current through the diffused Au (in the end surface), and may affect oscillation characteristics of the semiconductor laser device.

BRIEF DESCRIPTION OF THE INVENTION

According to the present invention, in forming a semiconductor laser device, an electrode comprising Au is patterned so that the electrode does not exist in the vicinity of a light emitting end surface. Thereby, even when an Si film is formed on the light emitting end surface, the Si film is prevented from contacting with the light emitting end surface.

In addition, after patterning the electrode, an insulating film (a silicon nitride film) is formed on the electrode for preventing the Si in the protective coating on the end surface from contacting with Au in the electrode, even when the Si film contacts with a surface of the electrode.

More specifically, the present invention provides a semiconductor laser device, comprising:

an electrode metal film formed on a crystal surface of a semiconductor substrate; and an Si film formed on a light emitting end surface;

wherein an interval of a specified distance is provided between the electrode metal film and the light emitting end surface.

The semiconductor laser device according to the present invention is useful, in particular, when the electrode metal film comprises Au.

Further, in the semiconductor laser device according to the present invention, an insulating film is further formed on the above electrode metal film. Particularly, in the semiconductor laser device according to the present invention, the insulating film comprises $SiN_x$, $Al_2O_3$, $SiO_2$ or $TiO_2$.

In the semiconductor laser device according to the present invention, the interval provided between the electrode metal film and the light emitting end surface is 1 $\mu$m or more, preferably 3 $\mu$m or more, more preferably 6 $\mu$m or more, and most preferably 11 $\mu$m or more.

The present invention also provides a method for manufacturing a semiconductor laser device, comprising:

a step of forming a p- (or an n-) electrode by forming an ohmic electrode metal film on one crystal surface of a semiconductor laser wafer, forming a bonding electrode metal film thereon, and patterning the electrode metal films;

a step of forming an n- (or a p-) electrode by forming an ohmic electrode metal film on the other crystal surface of the semiconductor laser wafer, forming a bonding electrode metal film thereon, and patterning the electrode metal films;

a step of dividing the semiconductor laser wafer into individual laser bars, each bar comprising a plurality of semiconductor laser chips by scribing cleavage lines on the semiconductor laser wafer;

a step of forming an Si film on a light emitting end surface which appears in the step of dividing the semiconductor laser wafer; and a step of forming a protective coating on the Si film.

In particular, the present invention also provides a method for manufacturing a semiconductor laser device, comprising:

a step of forming a first type of electrode by forming an ohmic electrode metal film on one crystal surface of a semiconductor laser wafer, forming a bonding electrode metal film thereon, and patterning the electrode metal films;

a step of forming a second type of electrode by forming an ohmic electrode metal film on the other crystal surface of the semiconductor laser wafer, forming a bonding electrode metal film thereon, and patterning the electrode metal films;

a step of dividing the semiconductor laser wafer into individual laser bars, each bar comprising a plurality of semiconductor laser chips by scribing cleavage lines on the semiconductor laser wafer;

a step of forming an Si film on a light emitting end surface which appears in the step of dividing the semiconductor laser wafer; and a step of forming a protective coating on the Si film, wherein the first type of electrode and the second type of electrode are different and are either a p-electrode or an n-electrode.

The method for manufacturing the semiconductor laser device according to the present invention is useful, in particular, when the electrode metal film comprises Au.

Further, in the method for manufacturing the semiconductor laser device of the present invention, the electrode metal films are patterned so that an interval between adjoining two p-electrodes and/or an interval between adjoining two n-electrodes are 2 $\mu$m or more, preferably 6 $\mu$m or more, more preferably 12 $\mu$m or more, and most preferably 22 $\mu$m or more.

That is, according to the method for manufacturing the semiconductor laser device of the present invention, since adjoining two electrodes are disposed on a semiconductor laser wafer at an interval of the above described distance, it becomes possible to eliminate generation of leakage current in the vicinity of the laser end surface and, thus, to manufacture a semiconductor laser device having an improved reliability as a laser device, even when errors occur in the step of patterning an electrode on a semiconductor laser wafer, in the step of scribing the semiconductor laser wafer, or in the step of dividing the semiconductor laser wafer into individual laser bars.

Further, in the method for manufacturing the semiconductor laser device according to the present invention, an insulating film is formed on the electrode metal film prior to forming the Si film. In this case, the insulating film comprises $SiN_x$, $Al_2O_3$, $SiO_2$ or $TiO_2$, and preferably the insulating film comprises $SiN_x$.

In addition, the method for manufacturing the semiconductor laser device according to the present invention further comprises a step of alloying the semiconductor laser wafer and the ohmic electrode after the step of forming a p- (or an n-) electrode and the step of forming an n- (or a p-) electrode.

For example, after a p- (or an n-) electrode is patterned, a p-ohmic electrode is alloyed with the semiconductor laser wafer by heating the wafer at 400 to 500° C. and, after an n- (or a p-) electrode is patterned, an n-ohmic electrode is alloyed with the semiconductor laser wafer by heating the wafer at 400 to 500° C.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The embodiments of the present invention will be described hereinafter in detail with reference to the accompanied drawings. First, the principles of the embodiments will be briefly described.

According to the present invention, in the case where an Si film is formed on a light emitting end surface of a semiconductor laser chip having an electrode comprising Au and, a protective coating having a specified reflectance is formed thereon, the electrode is formed at an interval of a specified distance from the laser emitting end surface in order to prevent the electrode comprising Au and the above Si film from contacting each other. Thereby, Au diffusion into the above Si film may be prevented, and generation of leakage current in the vicinity of the light emitting end surface may be controlled.

That is, the present invention enables to improve reliability of a laser device.

(First Embodiment)

1. Constitution of the Present Semiconductor Laser Device

Figure 1A:
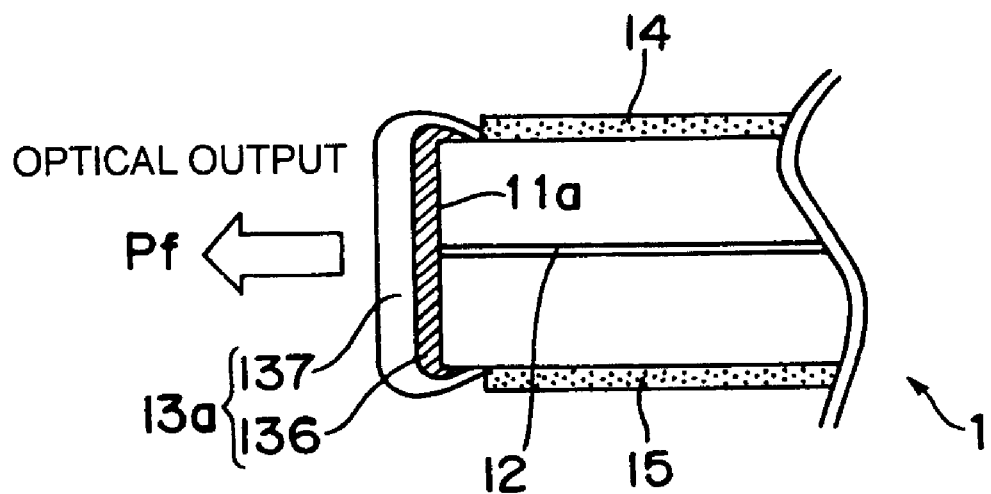
FIGS. 1A and 1B are enlarged cross-sectional views of main light emitting end surfaces of the semiconductor laser device according to a first embodiment (A) and a second embodiment (B) of the present invention.

An enlarged cross-sectional view of a main emitting end surface of a semiconductor laser device according to a first embodiment of the present invention is depicted in FIG. 1A. In the semiconductor laser device according to the first embodiment of the present invention, a p- (or an n-) electrode 14 comprising an ohmic electrode and a bonding electrode is formed on one crystal surface of a laser wafer and, an n- (or a p-) electrode 15 comprising an ohmic electrode and a bonding electrode is formed on the other crystal surface of the laser wafer.

Particularly, in a semiconductor laser device according to the first embodiment of the present invention, a first type of electrode comprising an ohmic electrode and a bonding electrode is formed on one crystal surface of a laser wafer and, a second type of electrode comprising an ohmic electrode and a bonding electrode is formed on the other crystal surface of the laser wafer, wherein the first type of electrode and the second type of the electrode are different and are either an n-electrode and a p-electrode.

For the sake of simplicity for describing the present invention in the Specification and the Drawings, the ohmic electrode and the bonding electrode are not described separately. However, in practice, an ohmic electrode is formed first on a substrate and a bonding electrode is formed thereon by vacuum evaporating. An ohmic electrode is for ohmic contacting a substrate and a bonding electrode, and a bonding electrode is for enabling buffering and adhesion upon wire-bonding or die bonding.

When a term "electrode" is simply used herein, it means a combination of ohmic and bonding electrodes.

Figure 12:
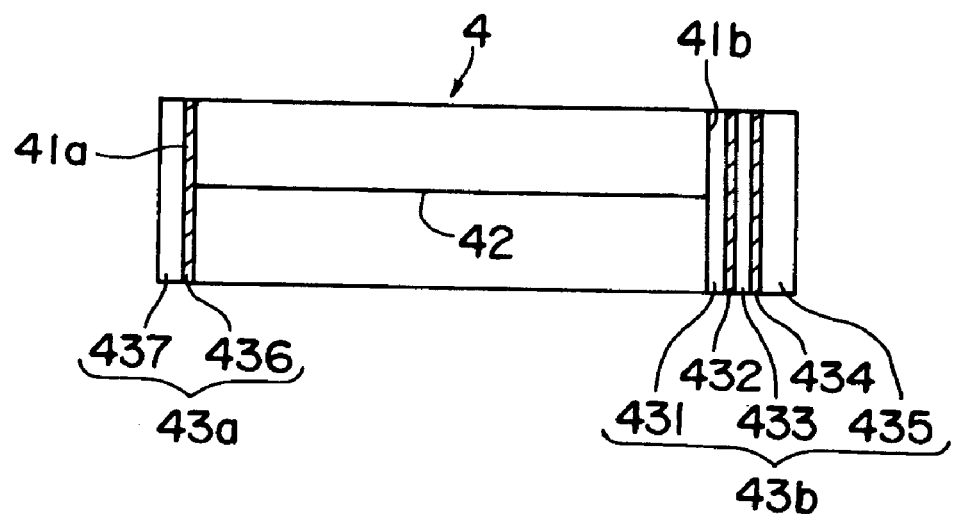
FIG. 12 is a schematic view showing a protective coating of another prior high output semiconductor laser device.
Figure 13:
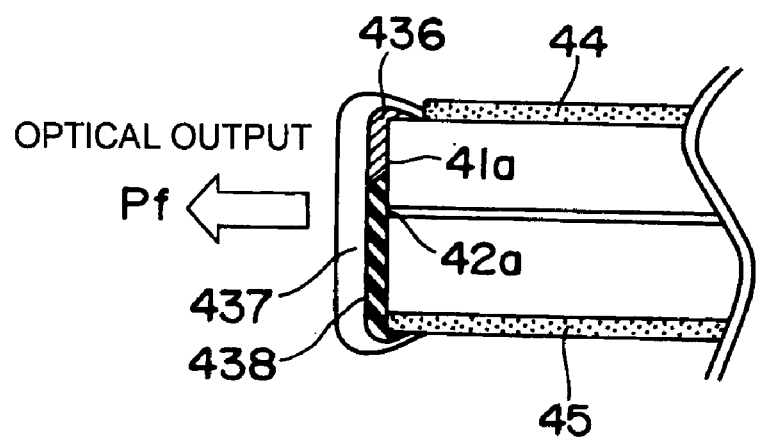
FIG. 13 is an enlarged cross-sectional view of main light emitting end surfaces of the prior semiconductor laser device.

A protective coating 13a is formed on a main emitting end surface 11a by forming an Si film 136 and forming an $Al_2O_3$ protective coating 137 thereon. In FIG. 1A, an emitting end surface 11b on the opposed side to the main emitting end surface 11a is omitted, an edge of an electrode is disposed at a specified distance from the emitting end surface 11b as in the side of the main emitting end surface 11a, and a protective coating 13b is formed like the protective coating 13a. In addition, in the case of a high output type semiconductor laser device, the same protective coating 13b as that shown in FIG. 12 is formed.

In order to prevent the Si film 136 from contacting with electrodes 14 and 15 when the film is formed, ends of the electrodes 14 and 15 are disposed at a specified distance from the emitting end surface of the laser device. If the distance from the ends of the electrodes to emitting end surfaces is 1 μm or more, the Si film does not contact with the electrodes when the film is formed by evaporation. Therefore, even when electrodes comprise Au, it is not possible that Si in the Si film reacts with Au to deteriorate reliability of a semiconductor laser device. In addition, the distance from the ends of the electrodes to emitting end surfaces depends on a width of the semiconductor laser device (a cavity length), and is set so as not to cause problems in wire-bonding or die-bonding. For example, when a semiconductor laser device having a cavity with a length of 800 μm is die-bonded, no problem arises if the distance from the ends of the electrodes to emitting end surfaces is 200 μm or less.

2. A Method of Producing the Semiconductor Laser Device

First, after an n-GaAs substrate is polished, an ohmic electrode and a bonding electrode are formed in this order on one side of crystal surfaces of the substrate by using the conventional technique such as vacuum evaporating, sputtering and the like, and the electrodes are patterned into a p- (or an n-) electrode 14. In this case, an interval between adjoining two electrodes 14 is set to be (2×l) μm.

After that, the substrate is heated in a furnace heated to 400 to 500° C. under the nitrogen atmosphere to alloy the substrate and the ohmic electrode. Thus, formation of the electrode 14 is completed.

Figure 2:
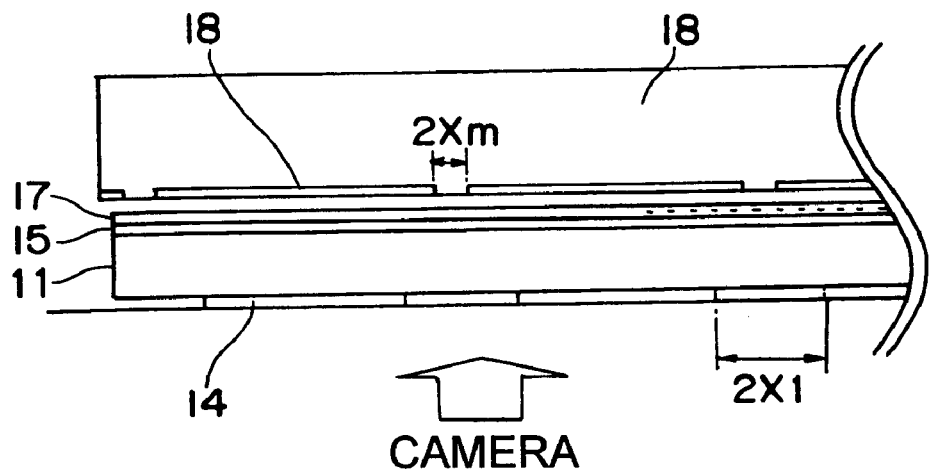
FIG. 2 is a schematic illustration explaining the exposing accuracy in the manufacturing method according to the present invention.

Next, on the other side of the substrate, an ohmic electrode and a bonding electrode are formed to form an electrode 15. Then, the bonding electrode is coated with a photoresist 17. After that, as shown in FIG. 2, the position of the wafer on which the photoresist 17 has been applied is adjusted based on the pattern of the electrode 14 which has been made by using a double-side aligner, and the positioned wafer is exposed to the light. A pattern for forming an electrode 15 is made on the photoresist on the bonding electrode by developing. In this case, an interval between adjoining two electrodes 15 is set to be (2×m) μm.

Here, since an error in aligning electrode patterns made on the both sides of the wafer is around ±10 μm, in order to secure a distance of 1 μm or more from ends of electrodes 14 and 15 to the emitting end surface after cleaving the wafer along a center line between adjoining two electrodes 14 (or 15) in a subsequent step, either an interval between adjoining two electrodes 14 (2×l) or an interval between adjoining two electrodes 15 (2×m) is set to be 22 μm or more. In this case, the other interval between the other electrodes is set to be 2 μm or more. Alternatively, both an interval between adjoining two electrodes 14 (2×l) and an interval between adjoining two electrodes 15 (2×m) may be set to be 22μm or more.

Then, areas of the electrode comprising an Au layer, which are uncovered with the photoresist, is etched by using an iodine etchant, and the photoresist is removed.

Finally, the substrate is heated in a furnace heated to 400 to 500° C. under the nitrogen atmosphere to alloy the substrate and the ohmic electrode. Thus, formation of the electrode 15 is completed.

It is effective that electrodes are patterned prior to alloying the substrate and the electrodes because it is impossible to thoroughly etch the alloyed electrodes with an iodine etchant.

Figure 3:
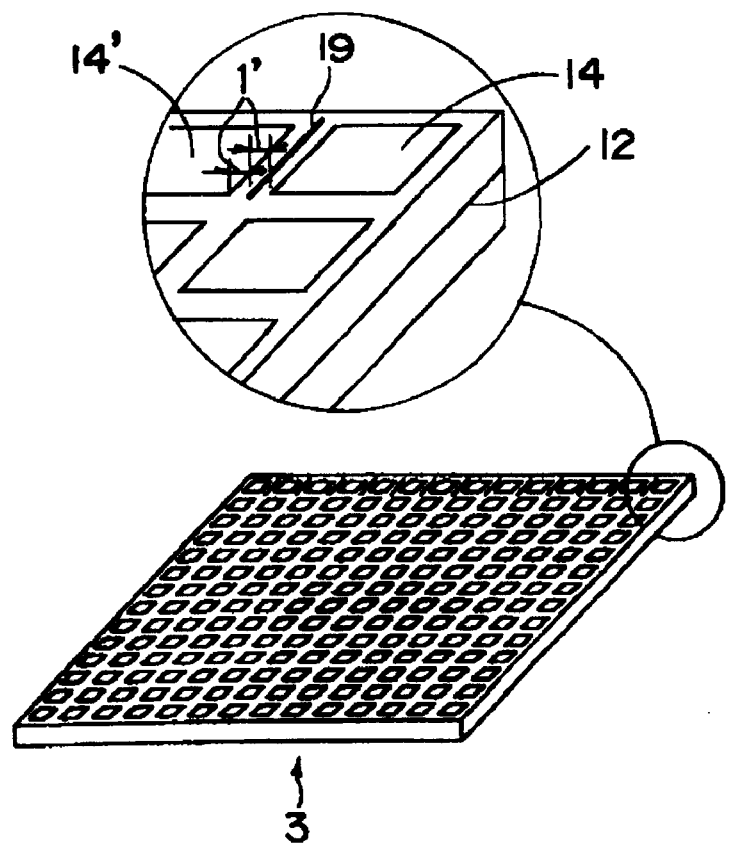
FIG. 3 is a schematic view showing a wafer of a semiconductor laser device.

Next, as shown in FIG. 3, a cleavage line 19 is formed by scribing extensively disposed between an electrode 14 of a specified element in a semiconductor laser wafer and an electrode 14' of an adjoining element in a direction orthogonal to an emitting section (channel) 12. In this case, since an error in scribing is around ±5 $\mu$m, in order to secure distances of 1 $\mu$m or more from ends of electrodes 14 and 15 to the cleaved end surface (l' and m'), it is necessary to set intervals between adjoining two electrodes [(2×l') and (2×m')] to be 12 $\mu$m or more.

Figure 4:
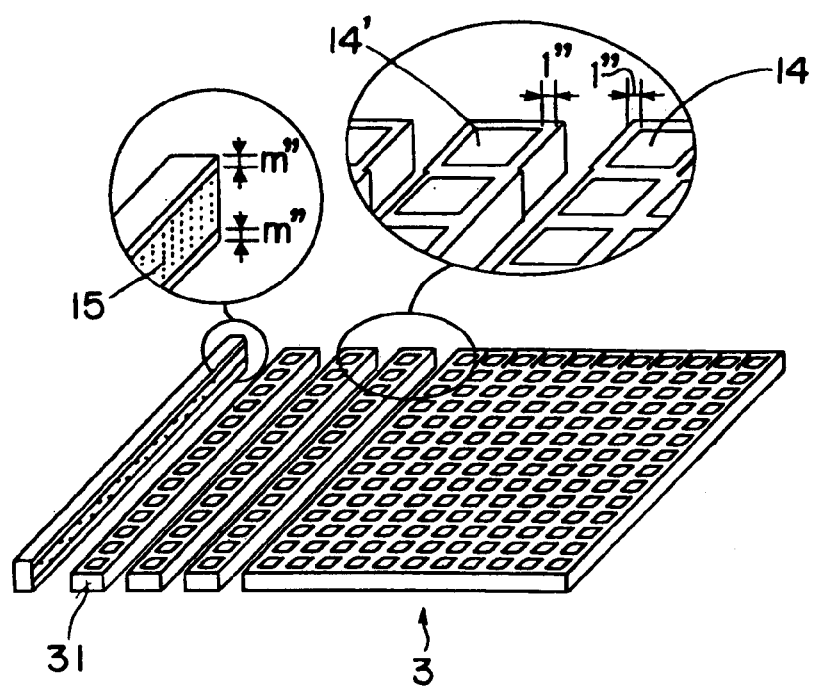
FIG. 4 is a schematic illustration explaining the scribing accuracy in the manufacturing method according to the present invention.
Figure 5:
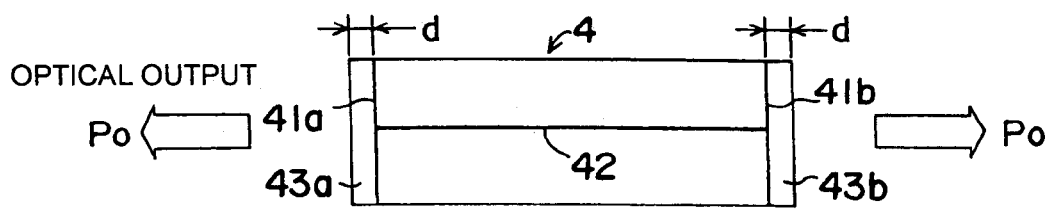
FIG. 5 is a schematic view showing a protective coating of the prior semiconductor laser device.

Next, as shown in FIG. 4, the wafer 3 is divided into laser bars 31 by cleaving. In this case, since an error in cleaving is around ±2 $\mu$m, in order to secure a distances of 1 $\mu$m or more from ends of electrodes 14 and 15 to the cleaved end surface (l" and m"), it is necessary to set intervals between adjoining two electrodes [(2×l") and (2×m")] to be 6 $\mu$m or more.

Figure 10:
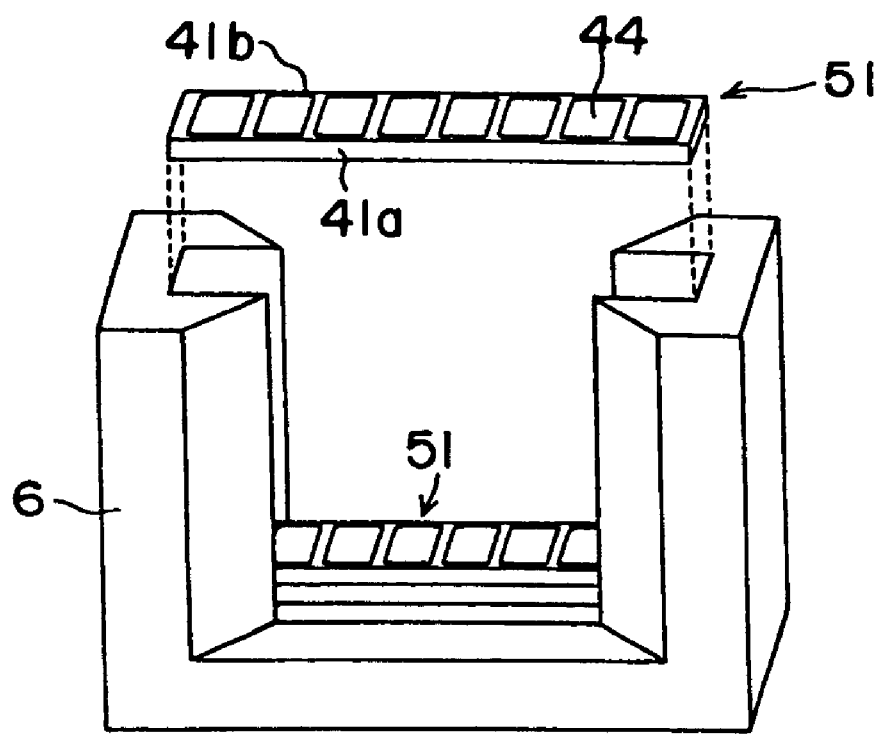
FIG. 10 is a schematic view showing a method for forming protective coatings, continuing from FIG. 9.

Then, in the same procedures as shown in FIG. 10, a plurality of the laser bars 31 obtained by dividing are loaded in a laser bar fixing device 6 such that the electrodes 14 face towards the same side. Further, all the laser bars 31 should be loaded so that all the emitting end surfaces 11a are positioned on the same side and, therefore, all the emitting end surfaces 11b are positioned on the same side. Next, on the emitting end surfaces 11a and 11b of laser bars 31 loaded in the laser bar fixing device 6, a protective coating having a specified reflectance is formed generally by using a vacuum evaporator 7 schematically shown in FIG. 11. The vacuum evaporator 7 is provided with a vapor source 72, a holder 73 for holding a plurality of the laser bar fixing devices 6, and a crystal oscillator 74 for monitoring the thickness of evaporated films, all in a chamber 71.

Figure 11:
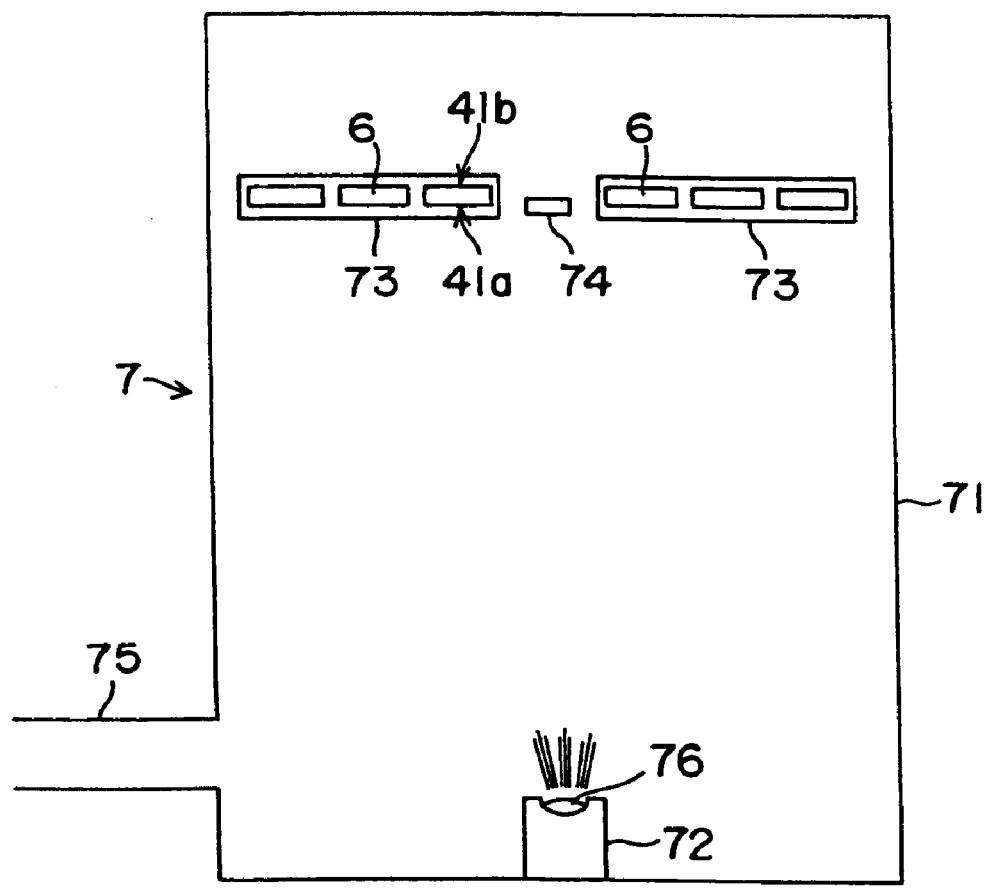
FIG. 11 is a schematic view showing a vacuum evaporator.

The following description discusses procedures of forming the protective coating. First, in the case for evaporating a protective coating onto the emitting end surface 11a, the holder 73 is disposed such that the emitting end surface 11a of a laser bar 31 faces the vapor source 72 side as shown in FIG. 11. Then, the chamber 71 is evacuated through a duct 75. After a specified degree of vacuum is obtained, an evaporation material 76 put in the vapor source 72 is heated and evaporated by electron beams and the like so that a protective coating is evaporated onto the emitting end surface 11a of the laser.

Figure 6:
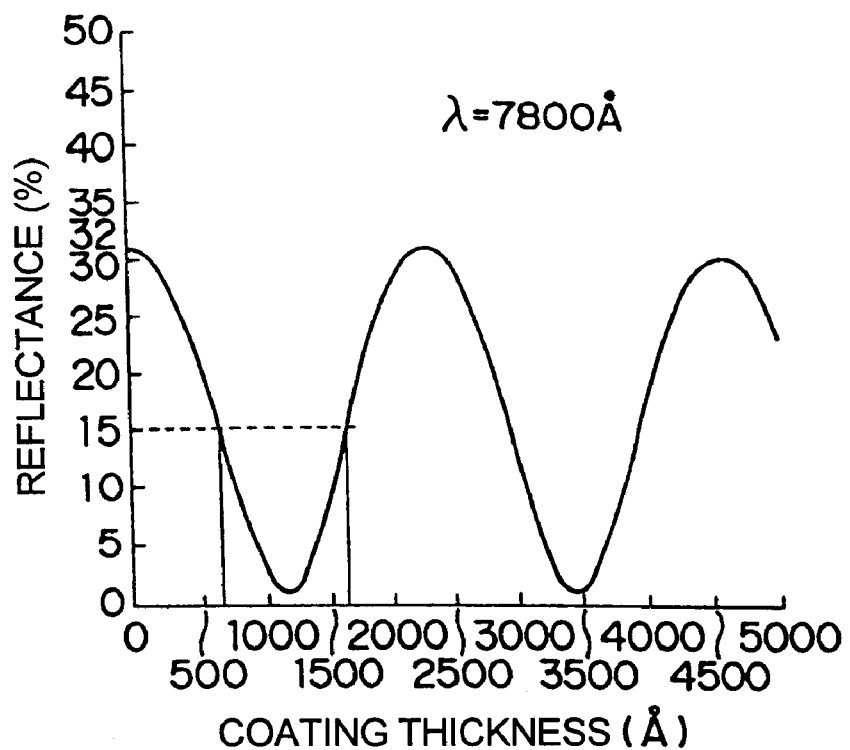
FIG. 6 is a view showing a change in a reflectance relative to a film thickness of the protective coating of the semiconductor laser device of FIG. 5.
Figure 7:
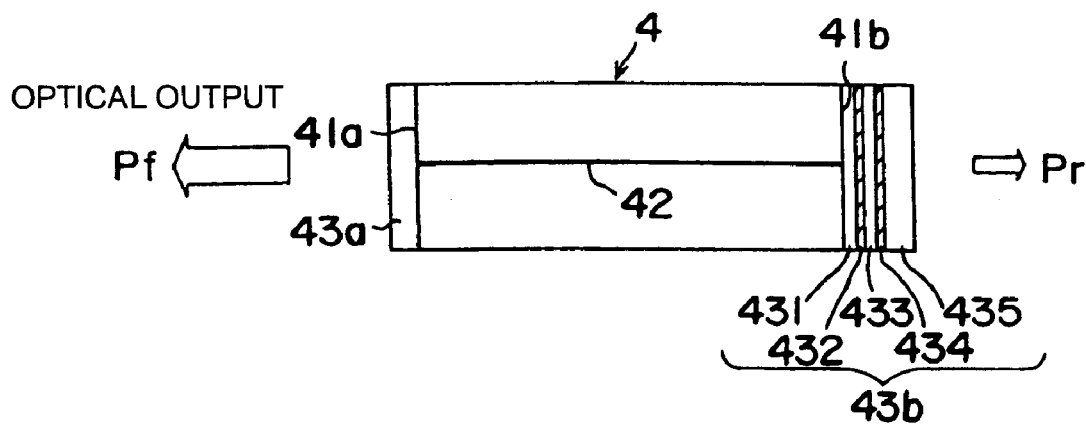
FIG. 7 is a schematic view showing a protective coating of the prior high output semiconductor laser device.
Figure 8:
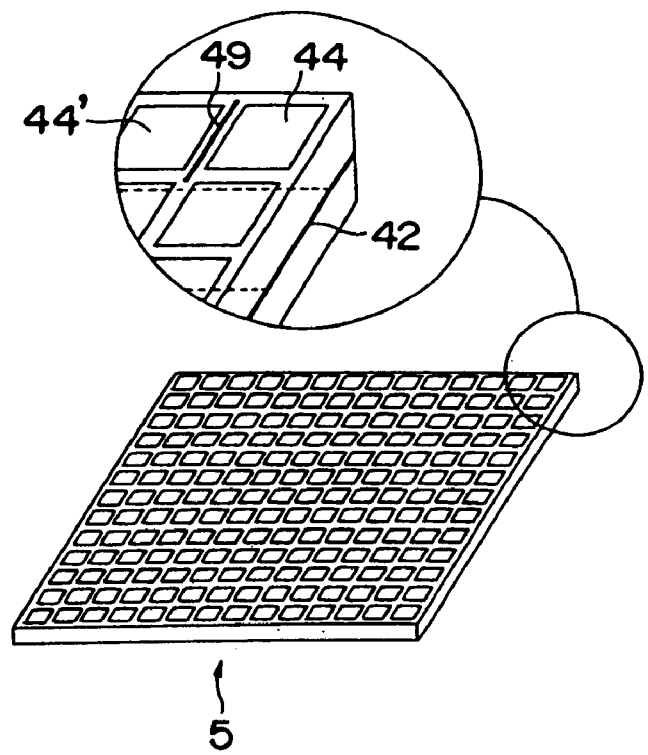
FIG. 8 is a schematic view showing a method for forming protective coatings in a semiconductor laser device.
Figure 9:
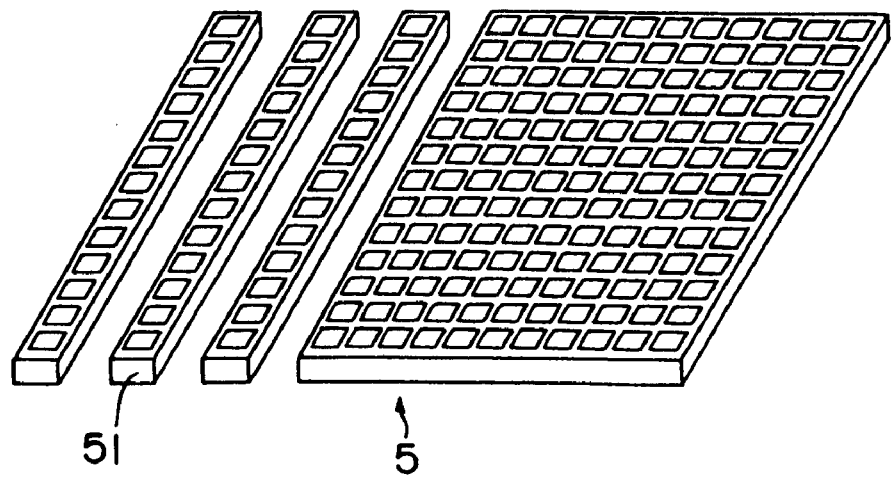
FIG. 9 is a schematic view showing a method for forming protective coatings, continuing from FIG. 8.

Specifically, an Si film 136 with a film thickness of approx. 20 Å is firstly formed on the light emitting end surface 11a at a film creation speed of 1 Å/sec or less. Then, an $Al_2O_3$ protective coating 137 with a specified film thickness is formed at a film creation speed of 80 Å/sec or less. The thickness of the $Al_2O_3$ protective coating 137 is set so as to obtain a reflectance as low as 15% or less. More particularly, when calculated letting a refractive index of an $Al_2O_3$ film be 1.60, a refractive index of a laser chip be 3.50, and an emission wavelength ($\lambda$) be 7800 Å, a coating thickness corresponding to a reflectance of approx. 15% or less is about 700 Å to 1600 Å (see FIG. 6).

As described above, a protective coating 13a is formed. After formation of the protective coating 13a is completed, the holder 73 is then rotated 180° for evaporating a protective coating onto the emitting end surface 11b based on the same procedures.

Although not shown in FIG. 1, in the case of a high output type semiconductor laser device, a low reflecting protective coating 13a (having a reflectance of approx. 15% or less) is formed on the side of the main emitting end surface 11a, and then a multilayered high reflecting protective coating 13b is formed on the side of the rear emitting end surface 11b.

The multilayered high reflecting protective coating 13b is composed of a laminated structure made up of: a first layer 131 and a third layer 133, each consisting of an $Al_2O_3$ film with a thickness equal to $\lambda/4$; a second layer 132 and a fourth layer 134, each consisting of an Si film with a thickness equal to $\lambda/4$; and a fifth layer 135 consisting of an $Al_2O_3$ film with a thickness equal to $\lambda/2$. For evaporation of this film, $Al_2O_3$ and Si are mounted on the vapor source 72 as evaporation materials 76. Then the first layer 131, the third layer 133, and the fifth layer 135, each consisting of an $Al_2O_3$ film, are evaporated through irradiation of the evaporation material $Al_2O_3$ with electron beams, and the second layer 132 and the fourth layer 134, each consisting of an Si film, are evaporated through irradiation of the evaporation material Si with electron beams.

Here, a forming speed (evaporation rate) for forming a protective coating on the both light emitting end surfaces 11a and 11b is controlled so as to be approximately constant till completion of evaporation. The evaporation rate is in this case controlled with a heating temperature. In the case of electron beam evaporation, therefore, the evaporation rate may be controlled with the intensity of electron beams. It is well known that in the case of resistance heating, the evaporation rate is controlled with an amount of electric current passed through a resistor. The evaporation rate is generally set in a range between several Å/sec to 30 Å/sec in the case of the evaporation material of $Al_2O_3$. Evaporation is conducted while coating thickness is monitored with use of the crystal oscillator 74. Evaporation is terminated when a prescribed coating thickness is obtained.

(Second Embodiment)

1. Constitution of the Present Semiconductor Laser Device

Figure 1B:
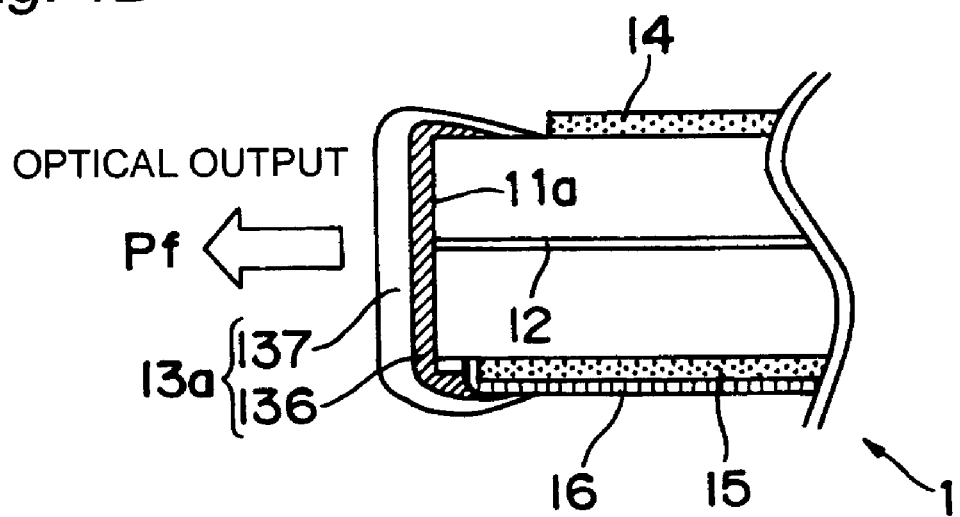

An enlarged cross-sectional view of a main emitting end surface of a semiconductor laser device according to a second embodiment of the present invention is depicted in FIG. 1B. As in the semiconductor laser device according to the first embodiment of the present invention, a p- (or an n-) electrode 14 comprising an ohmic electrode and a bonding electrode is formed on one crystal surface of a laser wafer and, an n- (or a p-) electrode 15 comprising an ohmic electrode and a bonding electrode is formed on the other crystal surface of the laser wafer.

Particularly, in a semiconductor laser device according to the second embodiment of the present invention, a first type of electrode comprising an ohmic electrode and a bonding electrode is formed on one crystal surface of a laser wafer and, a second type of electrode comprising an ohmic electrode and a bonding electrode is formed on the other crystal surface of the laser wafer, wherein the first type of electrode and the second type of the electrode are different, and are either an n-electrode and a p-electrode.

Ends of these electrodes are disposed at a specified distance from an emitting end surface as in the semiconductor laser device according to the first embodiment of the present invention.

In the semiconductor laser device according to the second embodiment of the present invention, an insulating film 16 comprising silicon nitride and the like is further formed on the electrode 15.

As in the semiconductor laser device according to the first embodiment of the present invention, a protective coating 13a is formed on a main emitting end surface 11a by forming an Si film 136 and forming an $Al_2O_3$ protective coating 137 thereon. In FIG. 1A, an emitting end surface 11b on the opposed side to the main emitting end surface 11a is omitted, an end of an electrode is disposed at a specified distance from the emitting end surface 11b as in the side of the main emitting end surface 11a, and a protective coating 13b is formed like the protective coating 13a. In addition, in the case of a high output type semiconductor laser device, the same protective coating 13b as that shown in FIG. 12 is formed.

As described above, since the insulating film 16 is formed on the electrode 15, the Si film 136 never contact directly with the electrode 15 even when the Si film contacts with the electrode 15, in some cases, in forming the film. Therefore, even when the electrode 15 comprises Au, since Au diffusion into an end surface by reaction of Au and Si is prevented, generation of leakage current in the vicinity of the light emitting end surface can be controlled, leading to improved reliability of a laser device.

2. A Method of Producing the Semiconductor Laser Device

In the semiconductor laser device according to the second embodiment of the present invention, electrodes 14 and 15 are formed by patterning and alloying based on the same procedure as those for manufacturing the semiconductor laser device according to the first embodiment of the present invention. Then, an $SiN_x$ insulating film 16 having a thickness of 0.3 to 0.4 $\mu$m is formed on the electrode 15 by plasma chemical vapor deposition. The insulating film 16 may comprise not only $SiN_x$, but also $Al_2O_3$, $SiO_2$ or $TiO_2$.

After that, according to the same procedures as those for producing the semiconductor laser device of the first embodiment, cleavage lines are formed to divide into laser bars 31.

Further, after a protective coating is formed on an end surface based on the same procedures as those for the first embodiment, the end surface is protected with a resist film according to the conventional technique for protecting an end surface with a resist film, and the insulating film $SiN_x$ on the electrode is etched with BHF.

The invention being thus described according to the above embodiments, it will be obvious that the same may be varied in many ways. For example, in the case where an Si film is applied as a fist layer of an end surface on the other side opposing to a main emitting end surface, it is also effective that ends of the electrodes are disposed at a specified distance from the end surface.

Such variations are not to be regarded as a departure from the spirit and scope of the invention, and all such modifications as would be obvious to one skilled in the art are intended to be included within the scope of the following claims.

What is claimed is:

1. A semiconductor laser device, comprising:
an electrode metal film disposed on a crystal surface of a semiconductor laser substrate; and
a Si film disposed on a light emitting end surface of the substrate;
wherein a predetermined interval is provided between the electrode metal film and the light emitting end surface in order to reduce oxygen damage to the Si film.

2. The semiconductor laser device as claimed in claim 1, wherein
the electrode metal film comprises Au.

3. The semiconductor laser device as claimed in claim 1, wherein
an insulating film is further formed on the electrode metal film.

4. The semiconductor laser device as claimed in claim 3, wherein
the insulating film comprises $SiN_x$, $Al_2O_3$, $SiO_2$ or $TiO_2$.

5. The semiconductor laser device as claimed in claim 1, wherein
the interval provided between the electrode metal film and the light emitting end surface is 1 $\mu$m or more.

6. The semiconductor laser device as claimed in claim 5, wherein
the interval provided between the electrode metal film and the light emitting end surface is 3 $\mu$m or more.

7. The semiconductor laser device as claimed in claim 5, wherein
the interval provided between the electrode metal film and the light emitting end surface is 6 $\mu$m or more.

8. The semiconductor laser device as claimed in claim 5, wherein
the interval provided between the electrode metal film and the light emitting end surface is 11 $\mu$m or more.

9. A method for manufacturing a semiconductor laser device, comprising:
forming a first type of electrode by forming an ohmic electrode metal film on one crystal surface of a semiconductor laser wafer and a bonding electrode metal film thereon, and patterning the electrode metal films;
forming a second type of electrode by forming an ohmic electrode metal film on another crystal surface of the semiconductor laser wafer, forming a bonding electrode metal film thereon, and patterning the electrode metal films;
dividing the semiconductor laser wafer into individual laser bars, each bar comprising a plurality of semiconductor laser chips having said first and second types of electrodes, by scribing cleavage lines on the semiconductor laser wafer;
forming a Si film on a light emitting end surface of an individual laser bar; and
forming a protective coating on the Si film.

10. The method for manufacturing the semiconductor laser device as claimed in claim 9, wherein the electrode metal film comprises Au.

11. The method for manufacturing the semiconductor laser device as claimed in claim 9, further comprising forming an insulating film on the electrode metal film prior to the forming of the Si film.

12. The method for manufacturing the semiconductor laser device as claimed in claim 11, wherein
the insulating film comprises $SiN_x$, $Al_2O_3$, $SiO_2$ or $TiO_2$.

13. The method for manufacturing the semiconductor laser device as claimed in claim 12, wherein
the insulating film comprises $SiN_x$.

14. The method for manufacturing the semiconductor laser device as claimed in claim 9, further comprising alloying the semiconductor laser wafer and the ohmic electrode after the forming of the first type of electrode or the forming of the second type of electrode.

15. The method for manufacturing the semiconductor laser device as claimed in claim 9, wherein the first type of electrode is a p-type electrode and the second type of electrode is an n-type electrode.

16. The method for manufacturing the semiconductor laser device as claimed in claim 15, wherein the electrode metal films are patterned so that an interval between two adjacent p-electrodes or an interval between two adjacent n-electrodes is 2 µm or more.

17. The method for manufacturing the semiconductor laser device as claimed in claim 16, wherein the electrode metal films are patterned so that an interval between two adjacent p-electrodes or an interval between two adjacent n-electrodes is 6 µm or more.

18. The method for manufacturing the semiconductor laser device as claimed in claim 17, wherein the electrode metal films are patterned so that an interval between two adjacent p-electrodes or an interval between two adjacent n-electrodes is 12 µm or more.

19. The method for manufacturing the semiconductor laser device as claimed in claim 18, wherein the electrode metal films are patterned so that an interval between two adjacent p-electrodes or an interval between two adjacent n-electrodes is 22 µm or more.

\* \* \* \* \*